United States Patent [19]

Davidson

[11] Patent Number: 5,065,277

[45] Date of Patent: Nov. 12, 1991

[54] THREE DIMENSIONAL PACKAGING ARRANGEMENT FOR COMPUTER SYSTEMS AND THE LIKE

[75] Inventor: Howard L. Davidson, San Carlos, Calif.

[73] Assignee: Sun Microsystems, Inc., Mountain View, Calif.

[21] Appl. No.: 553,521

[22] Filed: Jul. 13, 1990

[51] Int. Cl.⁵ ............................................. H05K 7/20
[52] U.S. Cl. ................................. 361/383; 357/80; 361/392; 361/396; 361/401; 361/406; 361/412
[58] Field of Search ............... 357/74, 80; 361/383, 361/384, 392, 393, 396, 394, 400, 401, 403, 406, 412

[56] References Cited

U.S. PATENT DOCUMENTS 4,225,900  9/1980  Ciccio et al. ..................... 361/403
4,539,622  9/1985  Akasaki ........................... 361/414
4,694,123  9/1987  Massey ............................ 361/414

FOREIGN PATENT DOCUMENTS 0155745  9/1983  Japan .............................. 357/75
0038845  2/1985  Japan .............................. 357/74
0194548  10/1985 Japan .............................. 357/75

Primary Examiner—Gregory D. Thompson
Attorney, Agent, or Firm—Blakely Sokoloff Taylor & Zafman

[57] ABSTRACT

A three dimensional arrangement for packaging planar arrays of circuit components in a plurality of essentially planar layers in which the layers lie closely adjacent to one another is disclosed. Each layer is separated by a shell that interposes slots for allowing coolant to pass between the layers and electrical conductors through the shell, so that when the layers are placed together, the conductors form a bus through the structure.

2 Claims, 2 Drawing Sheets

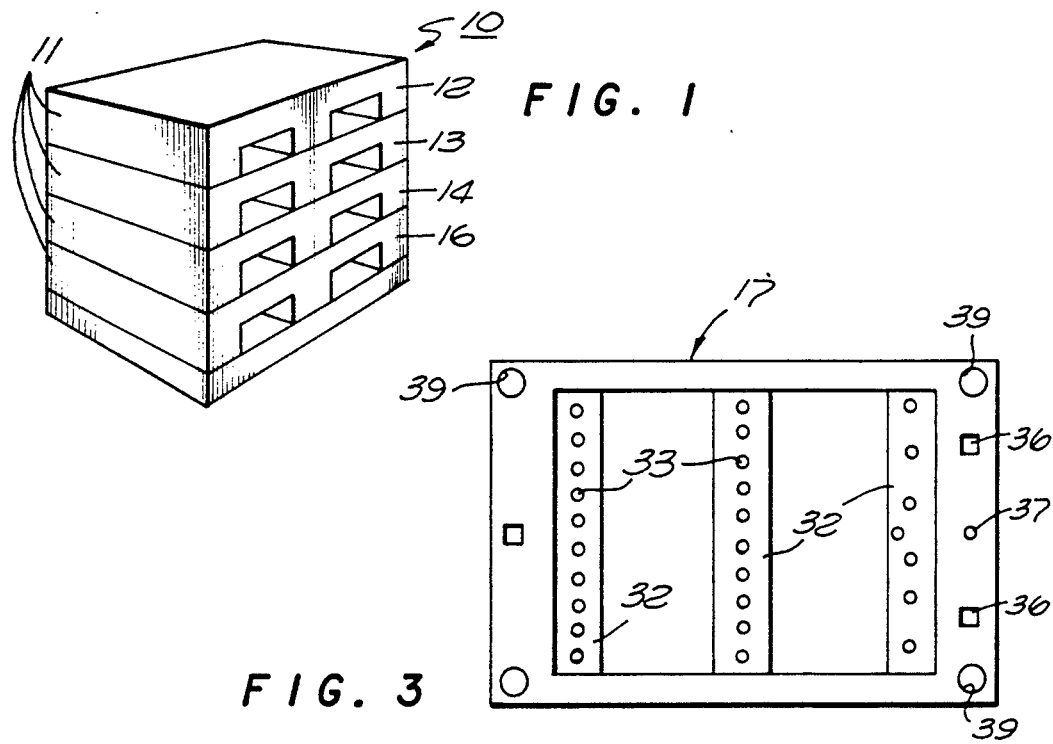
FIG. 1
FIG. 3
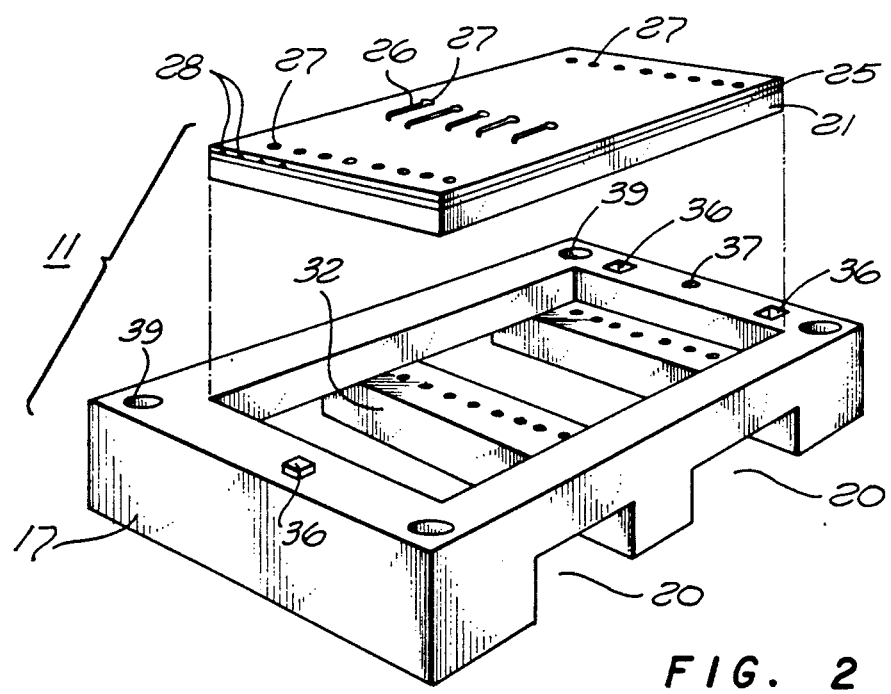
FIG. 2

THREE DIMENSIONAL PACKAGING ARRANGEMENT FOR COMPUTER SYSTEMS AND THE LIKE

BACKGROUND OF THE INVENTION

1. Field of the Invention

This invention relates to computer systems and, more particularly, to three dimensional packaging arrangements for providing very high density computer systems and other hybrid circuit systems.

2. History of the Prior Art

The development of computers has progressed along two avenues. First, there has been the constant search for higher speeds and more capability. In general, this has required more and larger circuit arrangements using faster components. At the same time, there has been the desire to place more and more powerful computers within the reach of individuals. Thus, there is a constant attempt to make desktop computers more powerful and at the same time smaller. To some extent, these twin desires have aided one another while in other ways they have been opposed. For example, the search for faster speeds of operation and higher packing densities to give more power to a computer has tended to reduce the size of components and the length of the conductors connecting those components. On the other hand, the staggering numbers of connectors necessary to modern computer circuits has to a great degree placed an ultimate limit on how small they can be made.

In general, typical personal computers and work stations today are constructed with their major components such as central processors, cache memory, input/output circuitry, and some random access memory laid out on a primary circuit board called a motherboard. Individual components such as additional processors, more random access memory, and hard disk controllers are all adapted to fit into connectors along an open air bus on the motherboard. This arrangement allows components to be cooled by air driven by fans and circulated through the circuit boards. It also allows individual circuit boards to be removed from and placed into the computer in the field by the user. However, the size reduction possible with such an arrangement is quite limited, especially if the addition in the field of a substantial number of peripheral components is to be allowed.

SUMMARY OF THE INVENTION

It is an object of the present invention to provide a three dimensional packaging arrangement for a very densely packed electronic system. It is another, more general, object of the present invention to provide a very densely packed computer system composed of planes of circuitry laid side by side which may be easily augmented or reduced with additional peripheral components.

It is another more particular object of the present invention to provide an arrangement for packaging a computer system composed of planes of circuitry laid side by side so that a very densely packed high speed computer is realized while utilizing a more highly effecient and easy method to cool the system.

These and other objects of the present invention are realized in an arrangement for packaging planar arrays of circuit components in a plurality of essentially parallel layers in which the layers lie closely adjacent one another, one or more of the layers comprising a substrate of ceramic material, circuit board means imbedded in the substrate, at least one layer of insulating material covering the circuit board means, conductors through the layer of insulating material to provide connections on the upper surface of the layer and conductors through the ceramic material to provide connections to the conductors through the layer of insulating material and to the lower surface of the ceramic material. Each and every layer may be comprised of the above list of elements. The elements are merely options dependent upon the user's particular purpose for the product. For example, the user may opt not to interconnect two layers, but the user may opt to use only one layer even though the conductors through the insulating material is present.

These and other objects and features of the invention will be better understood by reference to the detailed description which follows taken together with the drawings in which like elements are referred to by like designations throughout the several views.

BRIEF DESCRIPTION OF THE DRAWINGS

FIG. 1 is an isometric view of a packaging structure constructed in accordance with the invention.

FIG. 2 is an exploded isometric view of a portion of a packaging structure constructed in accordance with the invention.

FIG. 3 is a top view of a portion of a single layer of a packaging structure constructed in accordance with the invention.

DETAILED DESCRIPTION OF THE INVENTION

Figure 4:
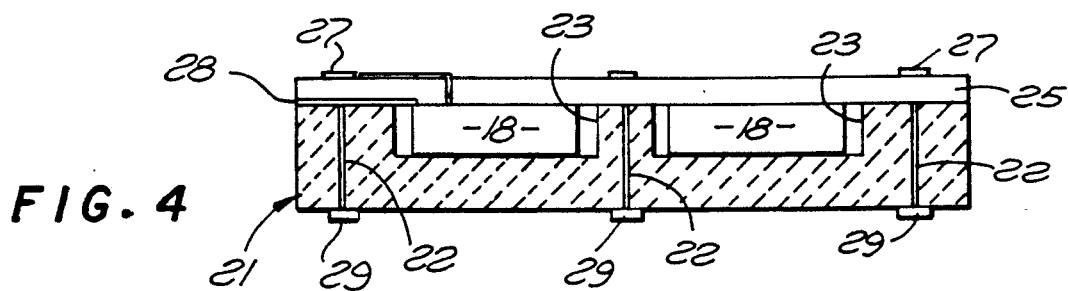
FIG. 4 is a side view of a ceramic layer portion of a single layer of a packaging structure constructed in accordance with the invention.

Referring now to FIG. 1, there is illustrated an isometric view of a packaging arrangement 10 constructed in accordance with the invention. The packaging arrangement 10 includes a plurality of individual layers 11 of operating circuit elements in general comprised of integrated circuits which individually may be any of a number of different components of larger systems. For example, a first layer 12 may include among other things circuitry constituting a central processing unit for a computer, a second layer 13 and a third layer 14 may include random access memory for the computer, and a fourth layer 16 may consist of input/output circuitry for the computer. In order to be able to easily augment the system, it is useful, although not necesary, that each of the layers serve a separable function in the system. Thus, a coprocessor or additional random access memory may be added to the system in the field by adding an additional layer 11 in the manner to be described. As illustrated in FIGS. 2 and 3, each of the layers 11 comprises one or more integrated circuit chips 18 (see FIG. 4) which may be hybrid circuits embedded in an insulating substrate 21. The layers 11 are all constructed to have opposing major surfaces parallel to one another so that a plurality of the layers 11 may be joined together as explained hereinafter to form a very densely packed electronic system. For example, it is expected that at least sixteen processors and 0.5 gigabytes of random access memory may be arranged as described and occupy a volume approximately four inches by four inches by one inch. Those skilled in the art will recognize that this arrangement may constitute a very powerful computer.

Each of the planar layers 11 of the arrangement 10 may be constructed using any technology which is capable of providing flat and parallel top and bottom surfaces.

Figure 5:
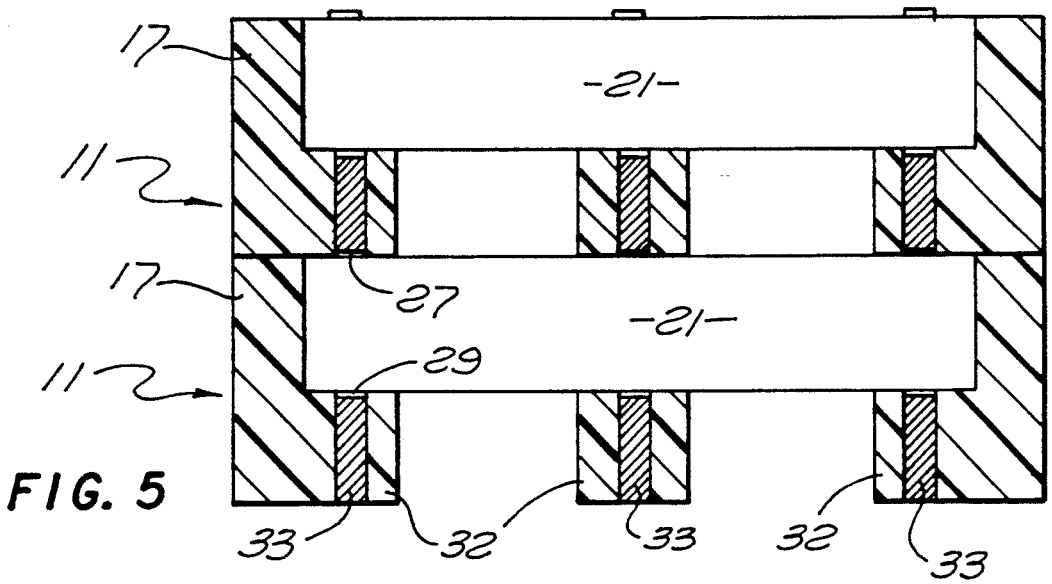
FIG. 5 is a cross-sectional view of two layers of a packaging structure constructed in accordance with the invention.

FIGS. 2, 3 and 5 illustrate frame elements which provide the outer shell 17 for two layers 11 of a presently preferred arrangement 10 from top and side views. As may be seen in FIGS. 2, 3, and 5, the shell 17 is an essentially box-like structure which is manufactured of an insulating material. The shell 17 has a rectangular hollow indentation in its upper surface adapted to hold the electronic hybrid circuitry which performs the electronic functions of the component or components of that layer 11. Each of the insulating shells 17 has slots 20 cut into its lower surface to open the bottom of the hollow indentation to the air. The shells 17 are adapted to be stacked on one another in the manner illustrated in FIG. 5.

A presently preferred technology for producing the hybrid circuitry of the individual layers 11 illustrated in FIGS. 2 and 3 includes a modification of a process developed by the General Electric Company. The General Electric process uses a single flat sheet of featureless ceramic material as a substrate 21 (see FIG. 4). In this substrate 21 are carved recesses or pockets 23 for receiving integrated circuit chips 18. The chips 18 and the pocketed substrate layer 21 are covered with a thin flat layer 25 of high temperature plastic material such as polyimide which may have adhesive on its lower surface to adhere to the pocketed substrate 21. The covering layer 25 (best seen in FIGS. 2 and 4) has holes burned through it by laser to allow connections to be made directly to the chips 18 lying in the pockets 23. A photo-resist process is used to place connectors 26 in the holes produced by the laser and to pattern connections including conductive pads 27 on the upper plastic layer 25.

The laser-cut holes are treated using an oxygen plasma cleaning process to remove condensed plastic vapors, an argon back sputter treatment is applied to remove approximately twenty angstroms of oxide from terminals on the chip 18, titanium is sputtered to provide an adhesion layer, copper is sputtered to produce a strike (or film) over the entire surface of the insulator and holes, and the surface is electroplated with ductile copper over the strike. Additional layers 25 of plastic may be laminated to the first layer 25, and additional connections 26 may be provided through the laser-burning and the above-explained cleaning and plating processes. An advantage of using the laser-burning process is that a laser may be made to stop on a conductor on a lower layer 25 because of the reflectivity of the conductor so that incisions may be very accurately cut.

The copper may be patterned to produce connector pads 27 on the top plastic layer 25, and leads 28 may be brought out to the edges at any layer 25 of the plastic covering as is illustrated in FIGS. 2 and 4. The pads 27 from the chips 18 may be placed at any convenient position on the upper surface of the layer 11. This produces a circuit which may have conductor pads 27 anywhere on the top surface thereby providing substantially more access to output terminals than in the usual connector arrangement of the prior art in which a chip has connector terminals only around its periphery. The exploded view of FIG. 2 demonstrates the number of terminals which any single layer may include.

This invention modifies the single layer arrangement produced by the General Electric process so that multiple layers 11 may be used in very close association with one another. This is accomplished by utilizing a co-fired ceramic base for each substrate 21, providing embedded vertical and horizontal conductors 22 in place of the bare ceramic base and providing a shell 17, with vertical conductors 33 in the rails 32, in order to separate the layers so that a cooling agent can be passed between the layers.

The pocketed substrate 21 may be constructed in a preferred embodiment of a kiln-fired ceramic called green sheet (a ceramic powder with an organic binder). Holes are punched through the ceramic sheet, and a silk screening machine is used to squeeze metallic (tungsten or molybdenum powder) ink through the holes. The sheet is put into a furnace to burn out the organic material; then the temperature is raised to sinter the ceramic and cause it to shrink, compressing the metallic powder in the hole into a solid conductor 22.

Using these conductors 22 in the ceramic base substrate layer 21 allows contact to be made from both the top and the bottom of any chip 18 in any layer 11. Moreover, the same conductors 22 connect to the conductors 28 running from the chips 18 within the pockets through the interconnect layers 25. Thus, the chips 18 may be connected to the pads 27 along the top surface and the pads 29 along the bottom surface which are themselves connected together through the substrate. Moreover, the pads 27 may connect to pads 29 without connecting to the chips 18.

Referring again to FIG. 5, it will be seen that the shell 17 has legs or rails 32 formed by the slots cut in its lower surface. These rails 32 carry vertical conductors 33 which are adapted to contact the pads 27 and 29 on the upper and lower surfaces of the substrate 21. The conductors 33 may be produced by drilling the insulating material of the shells 17 to provide holes which may be filled with gold-plated beryllium copper strands or similar malleable conductors. A similar form of such a conductor referred to as a Cin::Apse connector is manufactured by Cinch Connectors. The strands of wire are crumpled into the holes providing a plurality of redundant conductors 33 which emerge from both parallel surfaces of rails 32 to contact pads of the substrate 21. These conductors may be placed as illustrated in FIGS. 2 and 5 in rows so that they conduct completely through each of the rails 32.

Thus, when two layers 11 are pressed together, the upper ends of the conductors 33 are compressed into the surfaces of the pads 29 on the lower surfaces of the substrate 21 and the lower ends of the conductors 33 are compressed into the surfaces of the pads 27 on the upper surface of the substrate 21 to make connections to the chips 18 in the pockets of the two layers 11. Rather than conducting through conductors 22 in the substrate 21 in which the chips 18 are embedded, the conductors 33 may be placed to run vertically completely through the end rails of the shells 17 and jumpers may be run from those conductors 33 to make contact with the chips 18 at the interconnect layers 25 at the edges of the substrate 21. For typical computer arrangements such as CMOS circuits, power may be provided through the chips 18 in the same manner as other signals.

Figure 6:
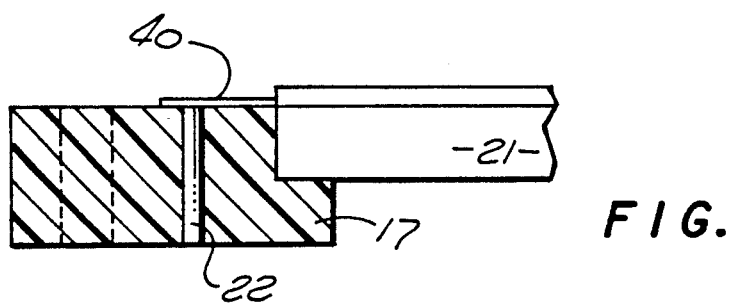
FIGS. 6 and 7 are cross-sectional views of details of a single layer of a packaging structure constructed in accordance with the invention.
Figure 7:
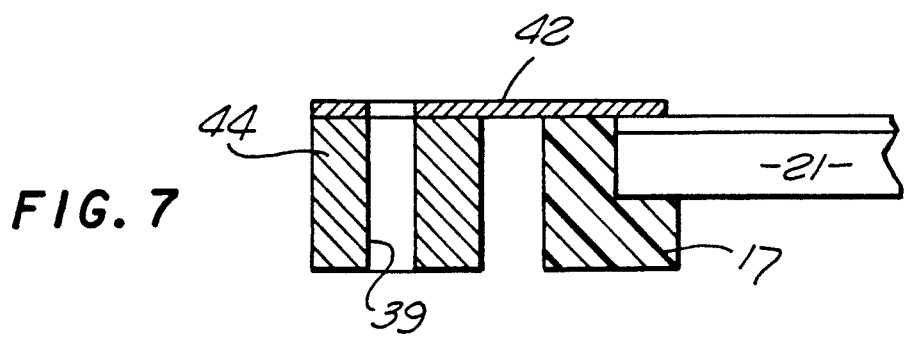

FIGS. 6 and 7 illustrate cross-sectional side views of details of an arrangement in accordance with the present invention for providing large amounts of power to an arrangement such as that illustrated in FIG. 1. In order to provide significant amounts of power to such an arrangement without the high impedances encountered in transferring the current through the conductors in the ceramic of the individual layers including the hybrid chips, a planar conductor of copper foil 40 may be run from the edge of each ceramic layer 11 to the hybrid chips therein to provide access to external power as is illustrated in FIG. 6. For meeting medium power requirements such as 60 amps per layer, larger conductors 22 running through the side rails 32 of the substrate shell 17 may be used to provide a low impedance power bus joining the layers 11 together and connecting to the copper foil conductors 40 to the chips.

For higher power requirements (e.g., 200 amps/layer), the copper foil may be replaced by thicker copper conductors 42 placed in horizontal slots in the substrate such as are shown in FIG. 7. These slots may be joined to metal blocks 44 running from parallel surface to parallel surface in the edge rails of the shell 17 holding the substrate. These blocks 44 form heavy bus bars of copper running through the substrate and replace the larger conductors illustrated in FIG. 6. When pressure clamps through the holes 39 (FIG. 3) compress the layers 11 together, they also force the conductors 42 in the horizontal slots and the blocks 44 together to form an essentially solid power bus bar structure. This arrangement allows the various layers to be replaced and augmented in the field.

It will be noted that the conductors 22 and 33 providing connections between the layers 11 may act as computer buses. This provides an especially important advantage in computers because the extremely short length of these conductors (e.g., an address bus with an overall length of one inch) provides overall exemplary values of 8 nanohenries of inductance, a few tens of milliohms of resistance, and 5 picofarads of capacitance. Such short conductors cut down the time to access circuit elements to a small fraction of the time required in present day computers.

Moreover, using the ceramic layers 11 and the conductors running through them together allows connective terminals to be structured at any place on the exterior surface of the structure 10. The number of terminals may scale with the surface area of the substrate 21 rather than the perimeter of any individual hybrid circuit chip 18. For example, it is possible to bring a critical signal out of the middle of a circuit board in the interior of the arrangement 10 to a pad on any surface of the substrate 21 and thus on any surface of the arrangement 10.

As is illustrated in the figures, the slots 20 cut through the shells 17 of the individual layers 11 allow circulation of air through the layers so that the entire arrangement 10 may be cooled. In this manner, the very densely packed arrangement may be operated at temperatures equivalent to those of systems in which the circuitry is arranged on open circuit boards. Fans and other air-moving arrangements may be provided to increase the degree of cooling. For cooling higher power arrangements, a special cooling is disclosed in copending U.S. patent application Ser. No. 07/553541, entitled APPARATUS FOR COOLING COMPACT ARRAYS OF ELECTRONIC CIRCUITRY, Davidson, filed July 13, 1990 on even date herewith.

It will be recognized by those skilled in the art that the arrangement of this invention allows entire computers to be constructed to fit in very small volumes. For example, a complete workstation (excluding the display monitor) may be placed in the very small volume of approximately one quarter inch by four inches by four inches by utilizing one layer 11 including a central processing unit, a coprocessor, and associated cache memory; a second layer 11 including input/output circuitry; and one or more additional layers 11 as desired of random access memory.

Illustrated in FIG. 3 are a number of key arrangements 36 which may be included in each of the layers in order to assure that the arrangement of layers 11 proceeds in the correct stacking order. Thus, for example, a particular layer 11 may have one or more keys 36 projecting from the bottom surface of the shell 17 adapted to join only to a top surface of another layer 11 having mating keys 36 recessed in the top surface of its shell 17. In like manner, alignment pins 37 may be placed in the shells 17 in order to assure precise alignment between layers of chips 18 embedded in ceramic substrates 21. Pressure clamps, not shown, may be placed through openings 39 provided in the shell 17 of each layer 11.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. In an arrangement for packaging planar arrays of circuit components, said arrangement including a substrate having circuit board means therein, with at least one layer of insulating material covering the circuit board means, and electrical connection means providing electrical connections on the upper surface of the layer of insulating material and around its periphery, and a plurality of conductors running through the substrate to bottom electrical connection means on the substrate and electrically joined to selected ones of the electrical connection means through the layer of insulating material to the circuit board means; an improvement comprising:

shell means of insulating material housing the substrate, the shell means having a lower surface with at least one slot cut into the lower surface allowing the circulation of cooling agent, and an upper surface with a hollow indentation in the upper surface which receives the substrate;

the shell further including rails, said rails including vertical conductors from the bottom to the top of the shell means, said rails further including means electrically joining the electrical connection means from the bottom surface of the substrate to the electrical connections on the upper surface of a next adjoining layer.

2. The arrangement for packaging planar arrays of circuit components as set forth in claim 1 wherein said electrical connection means includes electrical pads on surfaces of the arrangement.

* * * * *